(12) United States Patent
Farrier et al.

(10) Patent No.: US 6,392,260 B1
(45) Date of Patent: May 21, 2002

(54) ARCHITECTURE FOR A TAPPED CCD ARRAY

(75) Inventors: Michael George Farrier, Scottsdale, AZ (US); Charles Russell Smith, Waterloo (CA)

(73) Assignee: Dalsa, Inc., Ontario (CA)

(*) Notice: Subject to any disclaimer, the term of this patent is extended or adjusted under 35 U.S.C. 154(b) by 0 days.

(21) Appl. No.: 09/562,312

(22) Filed: May 1, 2000

Related U.S. Application Data
(60) Provisional application No. 60/131,580, filed on Apr. 29, 1999.

(51) Int. Cl.[7] .............................................. H01L 29/765
(52) U.S. Cl. ...................... 257/215; 257/217; 257/222; 257/231; 257/232; 257/239
(58) Field of Search ................................. 257/215, 217, 257/222, 231, 232, 233, 234, 239, 249

(56) References Cited

U.S. PATENT DOCUMENTS

| | | | |
|---|---|---|---|
| 4,237,383 A | 12/1980 | Kosonocky et al. | |
| 4,607,286 A | 8/1986 | Weimer | |
| 4,612,522 A | 9/1986 | Dyck | |
| 4,612,580 A | 9/1986 | Weimer | |
| 4,635,122 A | 1/1987 | Kato et al. | |
| 4,647,977 A | 3/1987 | Tower | |
| 4,661,788 A | 4/1987 | Levine | |
| 4,679,090 A | 7/1987 | Erhardt | |
| 4,731,656 A | * 3/1988 | Dischert et al. | 358/213.5 |
| 4,811,068 A | * 3/1989 | Kinoshita | 357/24 |
| 5,027,218 A | 6/1991 | Ueda | |
| 5,309,240 A | 5/1994 | Miwada | |
| 5,608,242 A | * 3/1997 | Kamasz | 257/216 |
| 5,715,002 A | 2/1998 | Cortiula | |

FOREIGN PATENT DOCUMENTS

| | | | |
|---|---|---|---|
| EP | 0 866 502 A2 | * | 3/1998 |
| EP | 866 502 A2 | * | 3/1998 |
| JP | 59-75772 | | 4/1984 |
| JP | 6-45576 | | 2/1994 |

* cited by examiner

Primary Examiner—Nathan Flynn
Assistant Examiner—Ahmed N. Sefer
(74) Attorney, Agent, or Firm—Dorsey & Whitney (57) ABSTRACT

A charge coupled device includes first and second pluralities of column registers and first and second register segments. The first plurality of column registers are splayed with respect to and on one side of a column direction line, and the second plurality of column registers are splayed with respect to and on another side of the column direction line. The first register segment is coupled to the first plurality of column registers, and the second register segment is coupled to the second plurality of column registers. The second register segment is spaced apart from the first register segment so as to define a layout area between the first and second register segments where at least one of an isolation register element and an output node is disposed. Each column register of the first plurality of column registers includes a plurality of column element wells. The column element wells of all of the first plurality of column registers constitute a plurality of well rows where each of the plurality of well rows is splayed with respect to a row direction line.

35 Claims, 7 Drawing Sheets

ARCHITECTURE FOR A TAPPED CCD ARRAY

The priority benefit of provisional application 60/131,580 filed Apr. 29, 1999 is hearby claimed.

BACKGROUND OF THE INVENTION

1. Field of the Invention

The invention relates generally to charge coupled device image sensors and specifically to structures that provide for optimized output node structures and isolation pixels in multi-tapped horizontal CCD readout registers.

2. Description of Related Art

Charge coupled devices (hereinafter CCDs) are widely used in video imaging and recording applications. For example, the architecture of a CCD video sensor may follow the form dictated by the National Television Standards Committee (NTSC) for video broadcast standards. Such CCD video sensor designs need at least 488 TV lines vertically, 500 to 800 pixels per TV line, have an optical format of 4/3 aspect ratio, and generate field interlaced video at a frame rate of 30 Hz. CCD architectures which achieved the goals of the video format imaging requirements generally fall into two categories: Interline Transfer (ILT) or Frame Transfer (FT) image sensors.

An alternative application of a CCD sensor is industrial inspection or vision equipment. The architecture of a CCD video sensor for this application may be optimized for maximum pixel resolution, or to maximize image frame rate, or both. Often inspection cameras used to inspect moving objects (e.g., on a continuous conveyor belt or rolled goods such as rolls of cloth) employ a line scan CCD sensor where a linear CCD sensor is oriented in a direction perpendicular to the direction of movement of the object being imaged. Advanced linear CCD sensor often employ an time delay and integrate technology and are referred to as TDI CCD sensors.

Figure 6:
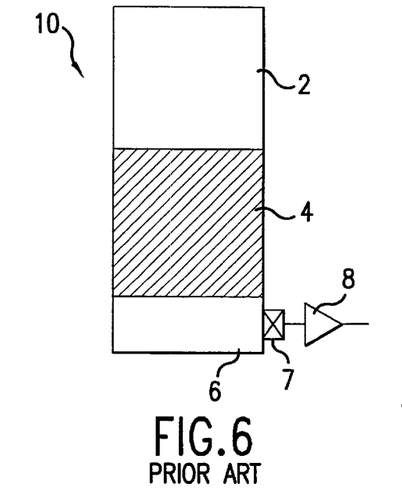
FIG. 6 is a layout diagram of a known frame transfer sensor.

In FIG. 6, known frame transfer sensor 10 includes imaging section 2 coupled to storage section 4. Frame transfer sensors rely on the quick transfer of image field data from an array of photo-sensitive photo-sites in imaging section 2 where photo-charge is integrated (i.e., the imaging section) to an optically opaque analog storage array (i.e., storage section 4), and the subsequent parallel to serial transfer of the video data through horizontal CCD readout shift register 6 (HCCD shift register) through output node structure 7, through buffer 8 to a camera circuit. An optically opaque storage array is a storage array that is covered by an optically opaque material such as an aluminum film so that the storage array is not photo-sensitive. The rapid vertical transfer of the image data from integration of the first video field is vital since the optical input onto the imaging section of the CCD sensor is continuous (not strobed or modulated during transfer).

Figure 7:
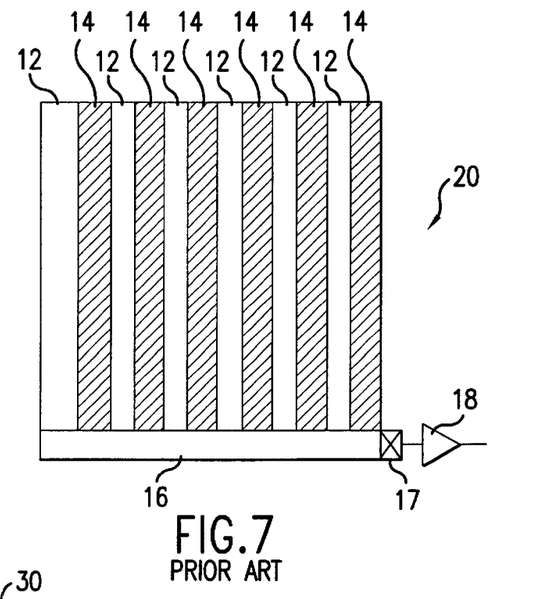
FIG. 7 is a layout diagram of a known interline transfer sensor.

In FIG. 7, known interline transfer CCD image sensor 20 (i.e., an ILT CCD sensor) includes imaging section 12 in a plurality of columns of photo-sites, each column disposed adjacent to an optically opaque interline transfer register 14 (e.g., covered with aluminum to render the transfer register insensitive to optical input). An ILT CCD sensor generally has no optically opaque storage section as does the frame transfer sensor. In an ILT CCD sensor, optical input is integrated in photo-sites 12 and then transferred to interline transfer registers 14. Then, during the integration of the next field of data, the field of image data in interline transfer registers 14 are parallel to serial transferred through horizontal CCD shift register 16 (HCCD shift register) through output node structure 17, through buffer 18 to a camera circuit.

Figure 8:
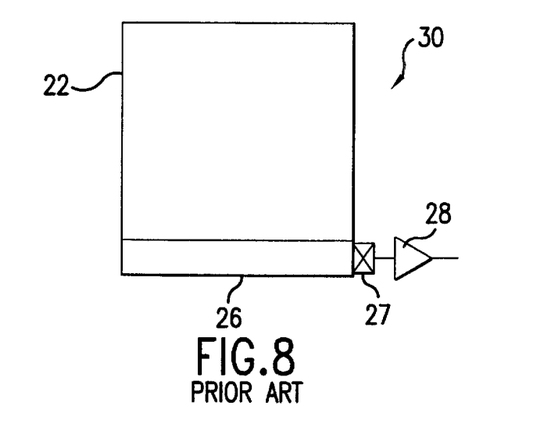
FIG. 8 is a layout diagram of a known time delay and integrate linear sensor.

In FIG. 8, known time delay and integrate (TDI) linear array sensor 30 includes imaging section 22 as in a frame transfer sensor, but the imaging section is generally coupled directly to horizontal CCD readout shift register 26, and from there through output node structure 27, through buffer 28 to a camera circuit. Imaging section 22 includes a plurality of columns, each column including a plurality of photo-sites. In operation, a camera lens focuses the image on the TDI CCD sensor. The image, that is the optical input to the TDI CCD sensor, is moving (e.g., on a conveyor belt). Thus, an image conjugate focused on the sensor appears to be moving. A portion of the image first appears on one pixel of the TDI CCD sensor, and then appears on another pixel of the sensor. The camera and sensor are arranged so that a portion of the moving image moves in a direction from the top of a column of photo-sites to the bottom of the column. The TDI CCD sensor is clocked to transfer charge down the columns of photo-sites at a rate equal to the rate that the portion of the image moves down the column. Charge generated at a first photo-site is transferred to the next photo-site at the same time that the image portion that generated the charge at the first photo-site moves to the next photo-site. In this way photo-charge is accumulated at the photo-site under the image portion as the image portion moves down the column. Thus the name, time delay and integrate (TDI).

Two-dimensional imaging arrays (e.g., in frame transfer sensors and in interline transfer sensors) generally take a snap shot of an image. The whole photo-active array of pixels integrates photo-charge for a period of time. At the end of the integration time, the information is transferred from the sensor to an external circuit element using a parallel to serial transfer scheme. Each horizontal line of pixel data is transferred into a horizontal CCD readout shift register. The line of data is then transferred serially through an output node structure at the end of the register and then through a buffer amplifier. Generally, the data rate at which signal charge can be transferred is limited to a rate that is less than the bandwidth of the output structure and buffer amplifier.

Similarly, in a TDI CCD sensor, the last pixel in each integrating column of photo-sites (i.e., the last horizontal line) is transferred into a horizontal CCD readout shift register. The line of data is then transferred serially through an output node structure at the end of the register and then through a buffer amplifier. Generally the data rate at which signal charge can be transferred is limited by the bandwidth of the output structure and buffer amplifier.

Common to all of the above CCD architectures is that data rate defining how fast data can be removed from the sensor chip is limited by the bandwidth of the output structure and buffer amplifier. In applications where the data rate must be in excess of the buffer bandwidth, the horizontal CCD readout shift register is often partitioned into sub-registers or segments. Each sub-register or register segment will then transfer signal charge to its own separate output node structure and buffer amplifier which operates at the bandwidth limit of the output structure and buffer. The data from several buffers is then multiplexed together to reconstruct the image at a higher data rate (i.e., the single buffer data rate multiplied by the number of output structures or taps). This register architecture is known as a multi-tapped horizontal readout register (FIG. 9).

Figure 9:
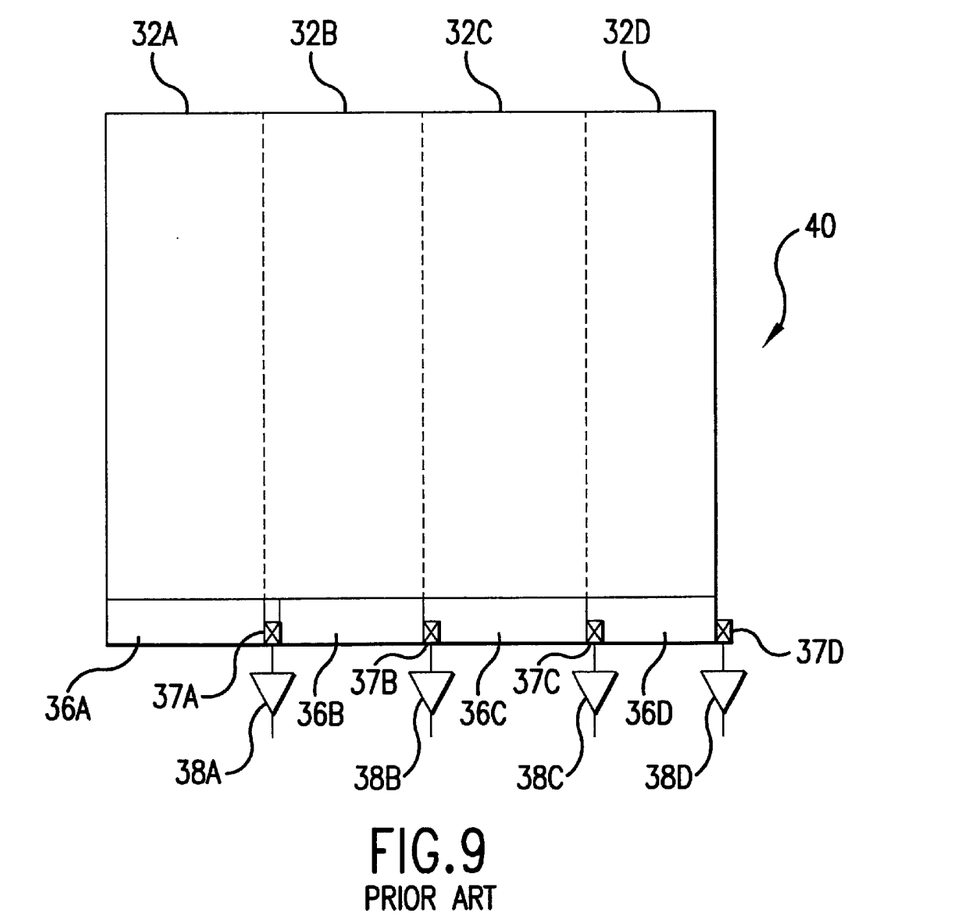
FIG. 9 is a layout diagram depicting a multi-tapped horizontal readout register.

Multi-tapped register designs require placement of an output node structure (37A, 37B, 37C and 37D of FIG. 9)

within an extent equal to the horizontal pitch (i.e., the pixel column spacing) of the register. For high density CCD sensor designs where the pitch is small in view of the minimum dimensions permitted by the design rules for the state of the processing technology used to make the CCD, it is difficult to position an output node structure within the register pitch such that the output node structure will have high performance (high conversion efficiency and low readout noise) while not sacrificing the performance of the horizontal register. See U.S. Pat. No. 5,608,242 entitled Variable Width CCD Register With Uniform Pitch and Charge Storage Capacity, incorporated herein by reference.

In order to increase the data rate from sensors, multi-tapped outputs in the horizontal readout section are commonly employed to allow different sections of the horizontal CCD to be read out simultaneously. Because of the space required for the output node structure, non-uniformities in the pixel pitch usually occur wherever an output tap is included. Furthermore, additional isolation pixels in the horizontal CCD are often desired to limit response non-uniformity in the first valid data pixel read out in each tapped section (commonly known as first pixel droop).

SUMMARY OF THE INVENTION

It is an object of the present invention to overcome limitations of the known art. It is another object to eliminate first pixel droop in these sensors while maintaining uniform pixel pitch. It is yet another object of this invention to provide additional flexibility in the design layout by the addition of a significant amount of layout area in the vicinity of each output node structure.

These and other objects are achieved in one embodiment of a charge coupled device that includes first and second pluralities of column registers and first and second register segments. The first plurality of column registers are splayed with respect to and on one side of a column direction line, and the second plurality of column registers are splayed with respect to and on another side of the column direction line. The first register segment is coupled to the first plurality of column registers, and the second register segment is coupled to the second plurality of column registers. The second register segment is spaced apart from the first register segment so as to define a layout area between the first and second register segments where at least one of an isolation register element and an output node is disposed. Each column register of the first plurality of registers includes a plurality of column element wells. The column element wells of all of the first plurality of column registers constitute a plurality of well rows where each of the plurality of well rows is splayed with respect to a row direction line.

These and other objects are achieved in another embodiment of a charge coupled device that includes first and second pluralities of column registers and first and second register segments. The first plurality of column registers are disposed on one side of a column direction line where each column register is splayed with respect to the column direction line by a corresponding and unique angle. The second plurality of column registers are disposed on another side of the column direction line where each column register is splayed with respect to the column direction line by a corresponding and unique angle. The first register segment is coupled to the first plurality of column registers, and the second register segment is coupled to the second plurality of column registers. The second register segment is spaced apart from the first register segment so as to define a layout area between the first and second register segments. Either an isolation register element or an output node, or both, is disposed in the layout area.

These and other objects are achieved in another embodiment of a charge coupled device that includes first and second pluralities of column registers and first and second register segments. Each column register of the first plurality of column registers includes a first register portion co-parallel with a column direction line and a second register portion splayed with respect to and on one side of the column direction line. Each column register of the second plurality of column registers includes a first register portion co-parallel with the column direction line and a second register portion splayed with respect to and on another side of the column direction line. The first register segment is coupled to the second register portion of the first plurality of column registers, and the second register segment is coupled to the second register portion of the second plurality of column registers. The second register segment is spaced apart from the first register segment so as to define a layout area between the first and second register segments. Either an isolation register element or an output node, or both, is disposed in the layout area.

These and other objects are achieved in another embodiment of a charge coupled device that includes a first plurality of column registers. Each column register of the first plurality of column registers includes a first register portion co-parallel with a column direction line and a second register portion splayed with respect to the column direction line. The first register portion of each column register of the first plurality of column registers includes a plurality of column element wells. The column element wells of all of first register portions of the first plurality of column registers constitute a first plurality of well rows Each of the first plurality of well rows is co-parallel to a row direction line. The second register portion of each column register of the first plurality of column registers includes a plurality of column element wells. The column element wells of all of second register portions of the first plurality of column registers constitute a second plurality of well rows. Each of the second plurality of well rows is splayed with respect to the row direction line.

These and other objects are achieved in another embodiment of a charge coupled device that includes a first plurality of column registers. Each column register of the first plurality of column registers includes a first register portion co-parallel with a column direction line and a second register portion also co-parallel with the column direction line. The first register portion of each column register of the first plurality of column registers includes a plurality of column element wells. The column element wells of all of first register portions of the first plurality of column registers constitute a first plurality of well rows. Each of the first plurality of well rows is co-parallel to a row direction line. The second register portion of each column register of the first plurality of column registers includes a plurality of column element wells. The column element wells of all of second register portions of the first plurality of column registers constitute a second plurality of well rows. Each of the second plurality of well rows is splayed with respect to the row direction line.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
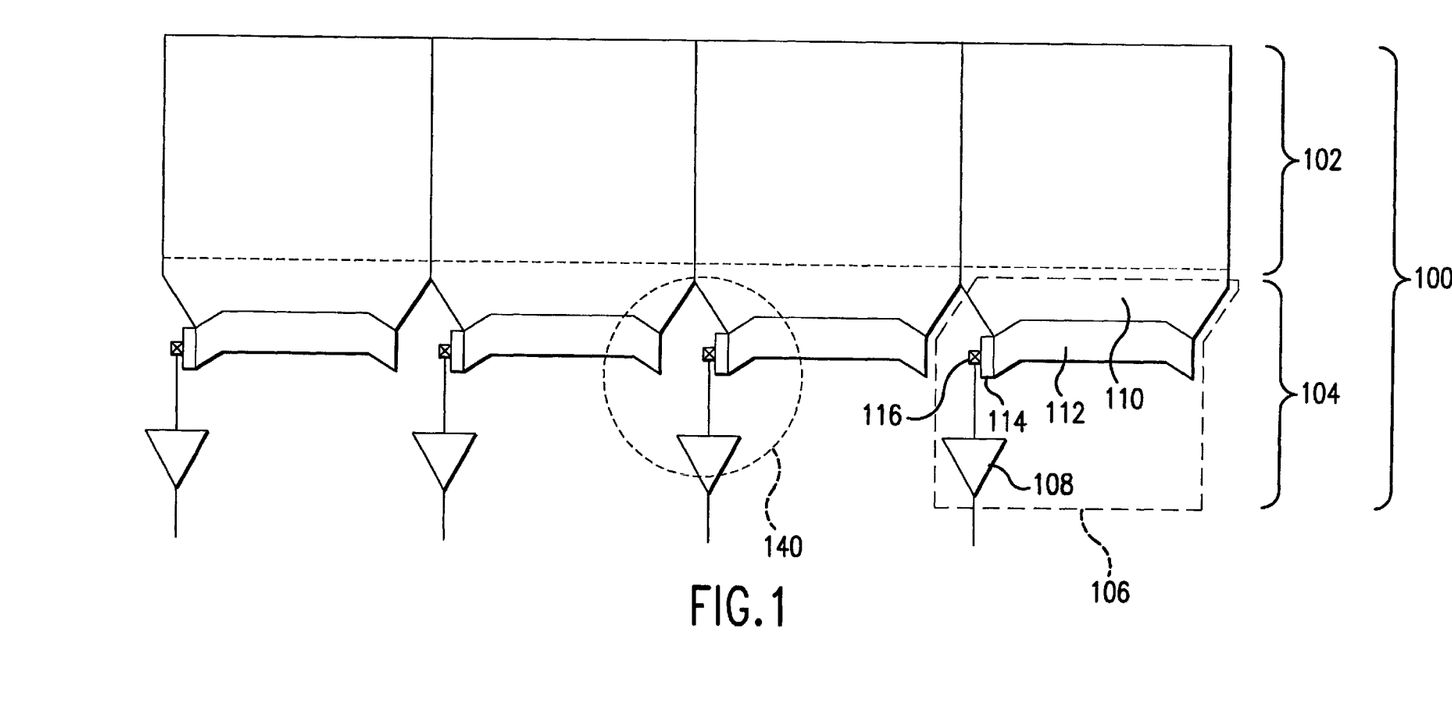
FIG. 1 is a layout diagram of a first embodiment of the present invention.

In FIG. 1, sensor 100 includes imaging section 102 and readout section 104. Imaging section 102 may be in the form of an interline transfer imaging section, frame transfer imaging section or TDI imaging section. Imaging section 102 includes a plurality of imaging subsections. Readout section 104 includes a plurality of readout subsections. First readout subsection 106 includes first plurality of column registers 110 coupled between a first imaging subsection and first horizontal segment register 112. Readout section 104 further includes first output node structure 116 coupled to first horizontal segment register 112. Readout section 104 may also include first isolation register 114 coupled between first horizontal segment register 112 and first output node structure 116. An output signal from first output node structure 116 is provided to first buffer amplifier 108. Typically, buffer amplifier 108 includes from one to five MOS transistors with a first stage arranged in a source follower configuration.

In a frame transfer sensor, column registers 110 may advantageously be comprised of the storage array registers disposed beneath an opaque optical shield. In interline transfer sensors and TDI sensors, column registers 110 may advantageously be comprised of isolation registers disposed beneath an opaque optical shield and coupled between the imaging section 102 and horizontal shift registers 112.

Column registers 110 and horizontal shift register 112 are arranged in a rectilinear layout in known sensors to minimize the layout area. However, in a multi-tapped horizontal readout register there is a need to insert isolation register 114 and output node structure 116 within the horizontal array pitch of imaging section 102.

Figure 2:
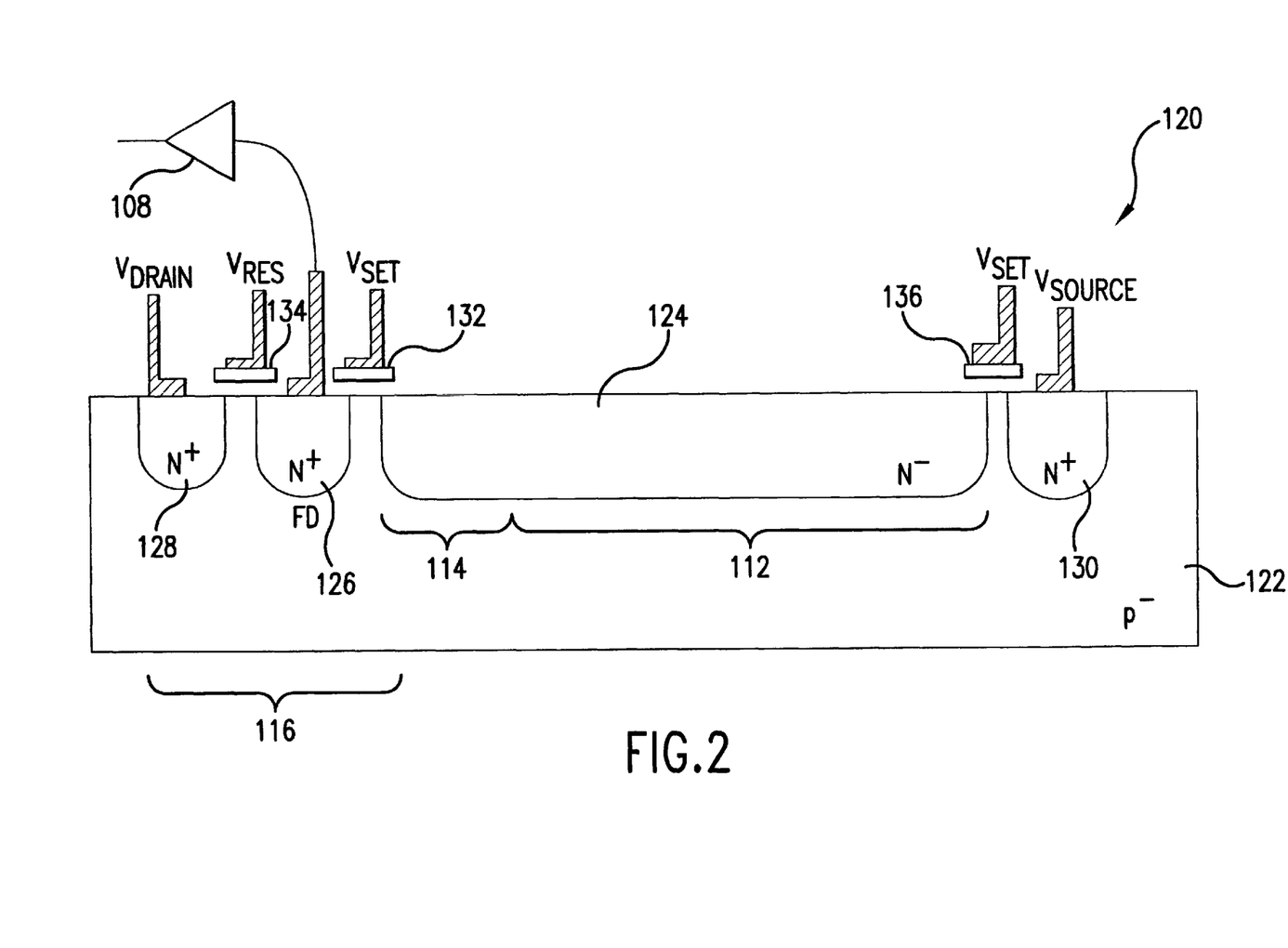
FIG. 2 is a section view through a horizontal readout register, an isolation register and an output node structure of the first embodiment.
Figure 3:
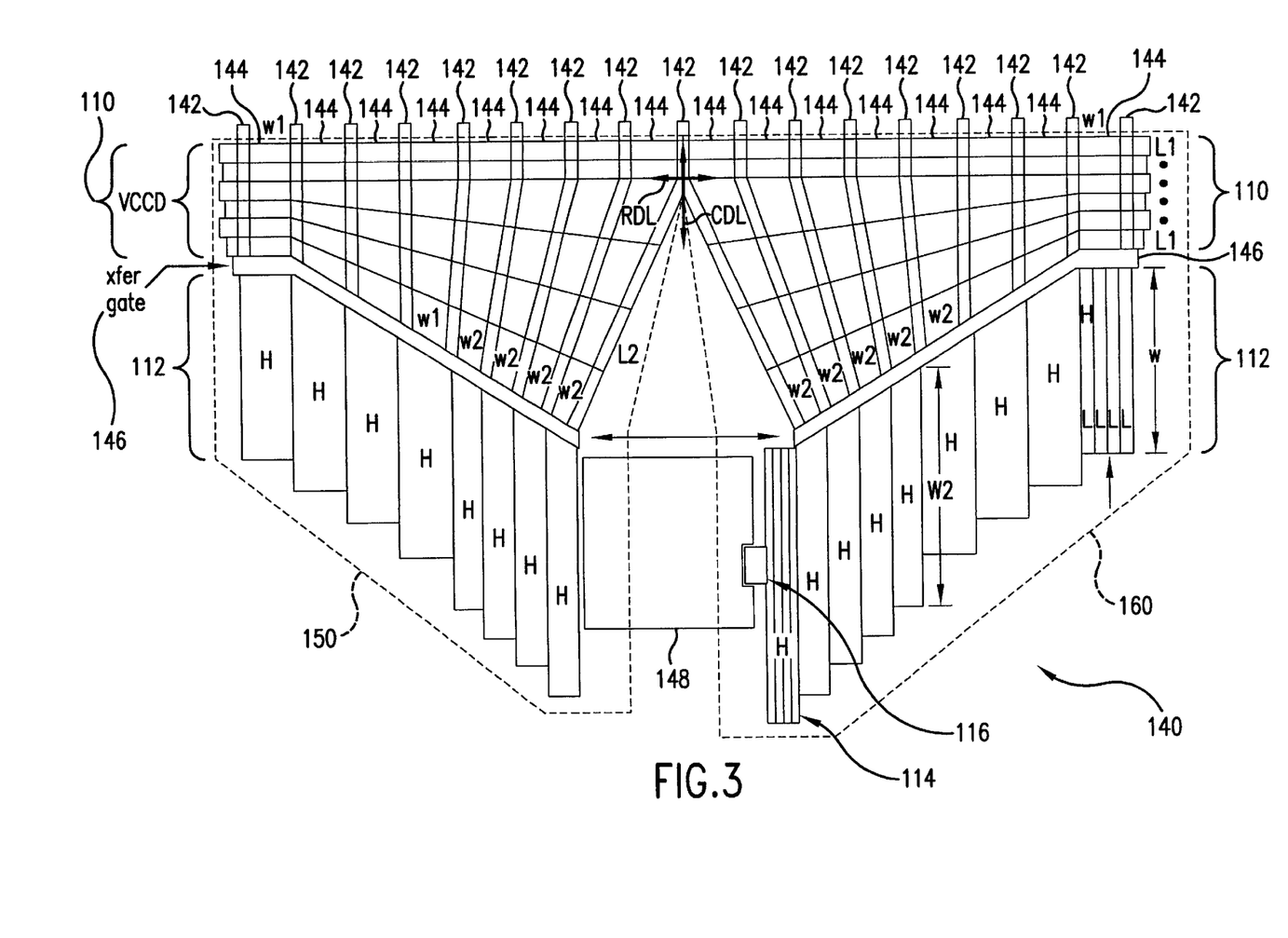
FIG. 3 is an enlarged plan view of a wedge tap region of the layout diagram of FIG. 1.

In the present invention, a rectilinear layout of column registers 110 and horizontal register segments 112 is distorted in a region around each tap into what is referred to herein as wedge tap 140 (FIG. 3). The wedge tap provides a layout area between adjacent horizontal register segments. This layout area provides sufficient area (and is in close proximity to the final stage or last element of each register segment 112) to locate isolation register 114, output node structure 116 (including set gate 132, floating diffusion 126, reset gate 134 and drain diffusion 128, FIG. 2) and a first stage of buffer amplifier 108 (usually an MOS transistor in a source follower configuration) without interrupting the uniform spacing of column registers 110 at their interface with imaging section 102. This layout area also provides sufficient space (and is in close proximity to the initial stage or first element of register segment 112) to locate set gate 136 and source diffusion 130 (FIG. 2) without interrupting the uniform spacing of column registers 110 at their interface with imaging section 102.

In FIG. 2, section 120 taken through horizontal readout register 112, isolation register 114 and output node structure 116 preferably includes an N⁻channel formed in a P⁻type semiconductor wafer (or an N⁻channel formed in a P⁻type well on an N type semiconductor wafer). Buried channel 124 is formed in doped semiconductor wafer 122. Horizontal readout register segment 112 and isolation register 114 are formed within the buried channel based on clocking gate electrodes (not shown) disposed above and insulated from the buried channel. Output node structure 116 includes output node "floating" diffusion 126 (labeled FD) coupled to output buffer 108 through an ohmic contact. Output node structure 116 also includes drain diffusion 128 coupled to a DC power source set to voltage $V_{DRAIN}$ through an ohmic contact. Floating diffusion (output node) 126 is coupled to isolation register 114 through a set gate formed by set gate electrode 132 disposed over and between buried channel 124 and floating diffusion (output node) 126. Set gate electrode 132 is supplied with signal $V_{SET}$, which when positive, transfers charge between isolation register 114 and floating diffussion 126. Floating diffusion (output node) 126 is also coupled to drain diffusion 128 through a reset gate formed by reset gate electrode 134 disposed over and between floating diffusion 126 and drain diffusion 128. Reset gate electrode 134 is supplied with signal $V_{RES}$, which when positive, transfers charge between floating diffussion 126 and drain diffusion 128. Source diffusion 130 is coupled to a DC power source set to voltage $V_{SOURCE}$ through an ohmic contact, and is also coupled to a first stage of horizontal register segment 112 through a set gate formed by set gate electrode 136 disposed over and between buried channel 124 and source diffusion 130. Set gate electrode 136 is supplied with signal $V_{SET}$, which when positive, transfers charge between source diffusion 130 and the first stage of horizontal register segment 112.

Isolation register 114 includes one or more register elements. Transfer electrode 146 (FIG. 3) is used to transfer signal charge from the last register element of each vertical register of column registers 110 into horizontal readout register segment 112. Horizontal register clocking electrodes are used to cause the fast transfer of signal charge through horizontal readout register segment 112 into isolation register 114 and from there into output node structure 116.

Clock driving circuits that supply voltage to the horizontal register clocking electrodes sometimes require a few clock cycles to stabilize voltage levels. Since clock pulse feed through may appear on the video signal, variances in the first few clock pulses can produce differences in the output waveform. Therefore, isolation register 114 is advantageously interposed between the last element of horizontal readout register segment 112 and output node structure 116. Preferably, isolation register 114 includes one or more register elements. Initial data from isolation register 114 is passed out through buffer 108 before image data is processed.

In FIG. 3, wedge tap 140 includes final wedge portion 160 of a first readout subsection 106 and an initial wedge portion 150 of a second readout subsection 106, the first and second readout subsections being adjacent subsections. Each wedge portion includes a plurality of column registers 110 coupled between a corresponding imaging subsection and a corresponding portion of horizontal register segment 112. Final and initial wedge portions are disposed symmetrically about column direction line CDL and together form wedge tap 140 at an apex defined at an intersection of column direction line CDL and row direction line RDL. Column direction line CDL is co-parallel with one direction of the pixel array of the imaging section 102, and row direction line RDL is co-parallel with another direction of the pixel array of the imaging section 102.

Final wedge portion 160 of a subsection of readout section 104 further includes output node structure 116 coupled to horizontal segment register 112. The final wedge portion of a subsection of readout section 104 may also include isolation register 114 coupled between horizontal register segment 112 and output node structure 116.

Initial wedge portion 150 of a subsection of readout section 104 includes an input source structure coupled to an input of horizontal segment register 112, the input source structure including source diffusion 130 and source set gate 136 (FIG. 2) to set the voltage level of horizontal segment register 112. Other mechanisms may be used to set the initial voltage set into horizontal register segment 112.

Column registers 110 are formed with channel stops 142 so as to define channels 144 therebetween. Channels 144 all have a width W1 (defined by the clear space between adjacent channel stops 142) at the interface where column registers 110 couple to imaging subsections of imaging section 102. Imaging section 102 defines an array pitch as the spacing between pixel columns (or vertical CCD registers), and this array pitch is the same as the center to center spacing between channel stops 142 at the interface where column registers 110 couple to imaging subsections of imaging section 102.

A clocking structure, preferably doped poly crystalline silicon (hereinafter poly), transversely overlays channels 144 to form column registers 110 and to transfer charges from imaging section 102 to horizontal register segment 112. A width of a single poly line defines a length, L1, of a single well in channel 144. Between imaging section 102 and row direction line RDL, all wells used to transfer charge in column registers 110 are rectangular and measure W1 by L1. Column registers 110 may include any number of elements between imaging section 102 and row direction line RDL and may include no elements. Each element includes plural wells defined beneath corresponding poly clock lines. In a two phase clocking arrangement, a register element includes two wells. In a three phase clocking arrangement, a register element includes three wells. In a four phase clocking arrangement, a register element includes four wells.

Between row direction line RDL and transfer gate 146, channel stops 142 within a predetermined number of channel stops from the column direction line CDL (e.g., 4 channel stops not including the central channel stop in FIG. 3) are bent at the point they cross row direction line RDL at an angle so that channels 110 are splayed symmetrically outward about column direction line CDL. The widths of the channels defined between channel stops 142 become more narrow where the channel stops are bent until the width diminishes to width W2 at the interface where column registers 110 couple through transfer gate 146 into horizontal register segment 112.

FIG. 3 shows the pitch of the imaging section to be W1 and the length of the last four horizontal register elements of register 112 (i.e., adjacent to isolation register 114) to be W2. Persons of ordinary skill in the art in light of this disclosure will appreciate that the length of register elements in horizontal register 112 will vary from a short length (depicted W2 in FIG. 3) for the register element adjacent to isolation register 114 to a longer length in central elements (e.g., 162, FIG. 5). This variation in horizontal register element length may vary in one or more uniform steps, or vary continuously. However, it is necessary that the horizontal register elements in register 112 match up with vertical registers in column registers 110 to provide efficient transfer of charge through transfer gate 146. In FIG. 3, column register 110 are depicted as bent at row direction line RDL, but otherwise straight, at least in each segment. Persons of ordinary skill in the art in light of this disclosure will appreciate that column registers 110 maybe curved or arched as long as the horizontal register elements in register 112 match up with vertical registers in column registers 110 to provide efficient transfer of charge through transfer gate 146.

Between row direction line RDL and transfer gate 146, clock lines (preferably poly) that form the clocking structure are also bent at a line that is parallel to and a predetermined distance from (e.g., as measured by a number of channel stops) column direction line CDL (e.g., 7 channel stops not including the central channel stop in FIG. 3). The clock lines also become wider (i.e., the underlying well formed in channel 144 becomes longer). Areas of the wells formed in channels 144 under the clock lines are thereby maintained equal to or greater than the area defined by W1 by L1 so as to be capable of carrying all of the charge transferred from imaging section 102 without blooming.

Persons of ordinary skill in the art in light of this disclosure will appreciate that the clock lines may be straight, as shown in FIG. 3, or may be curved or may even be piecewise straight to follow a generally curved line as long as the wells formed under the clock lines are equal to or greater than the area defined by W1 by L1 so as to be capable of carrying all of the charge transferred from imaging section 102 without blooming.

Figure 4:
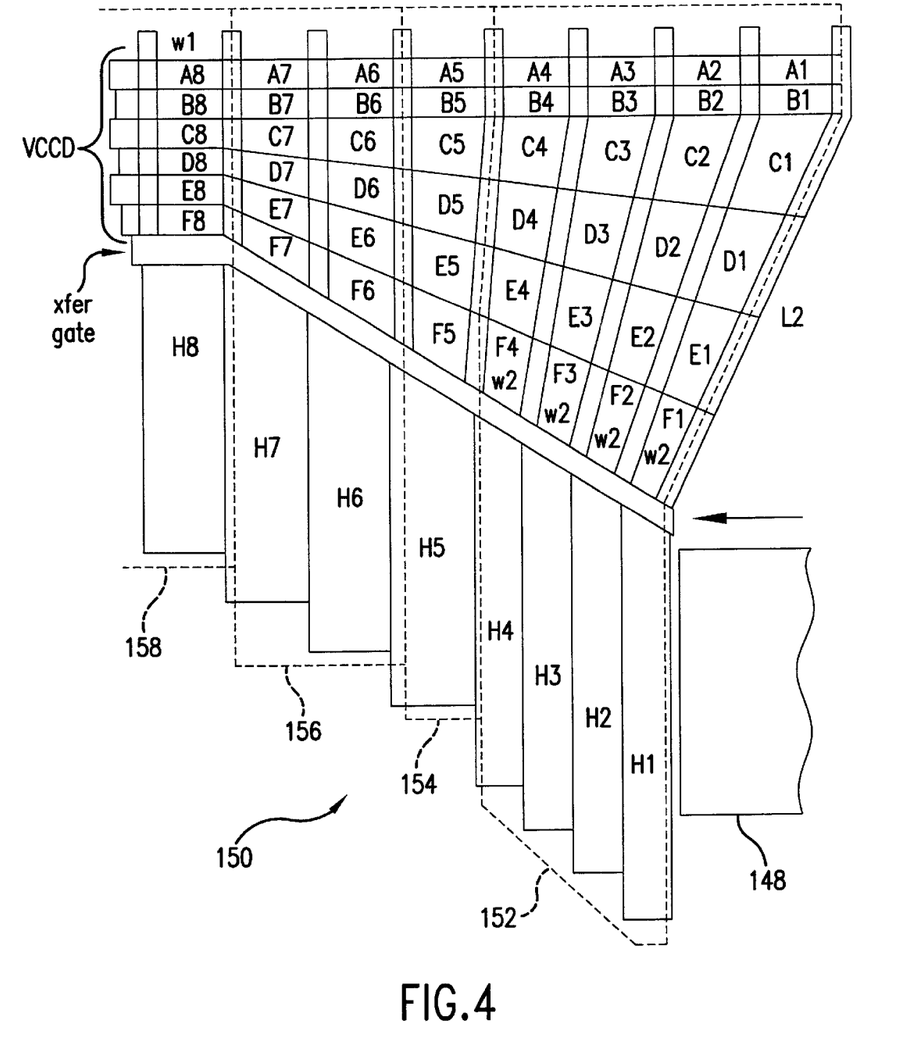
FIG. 4 is an enlarged plan view of an initial wedge portion of the wedge tap region of the layout diagram of FIG. 1.
Figure 5:
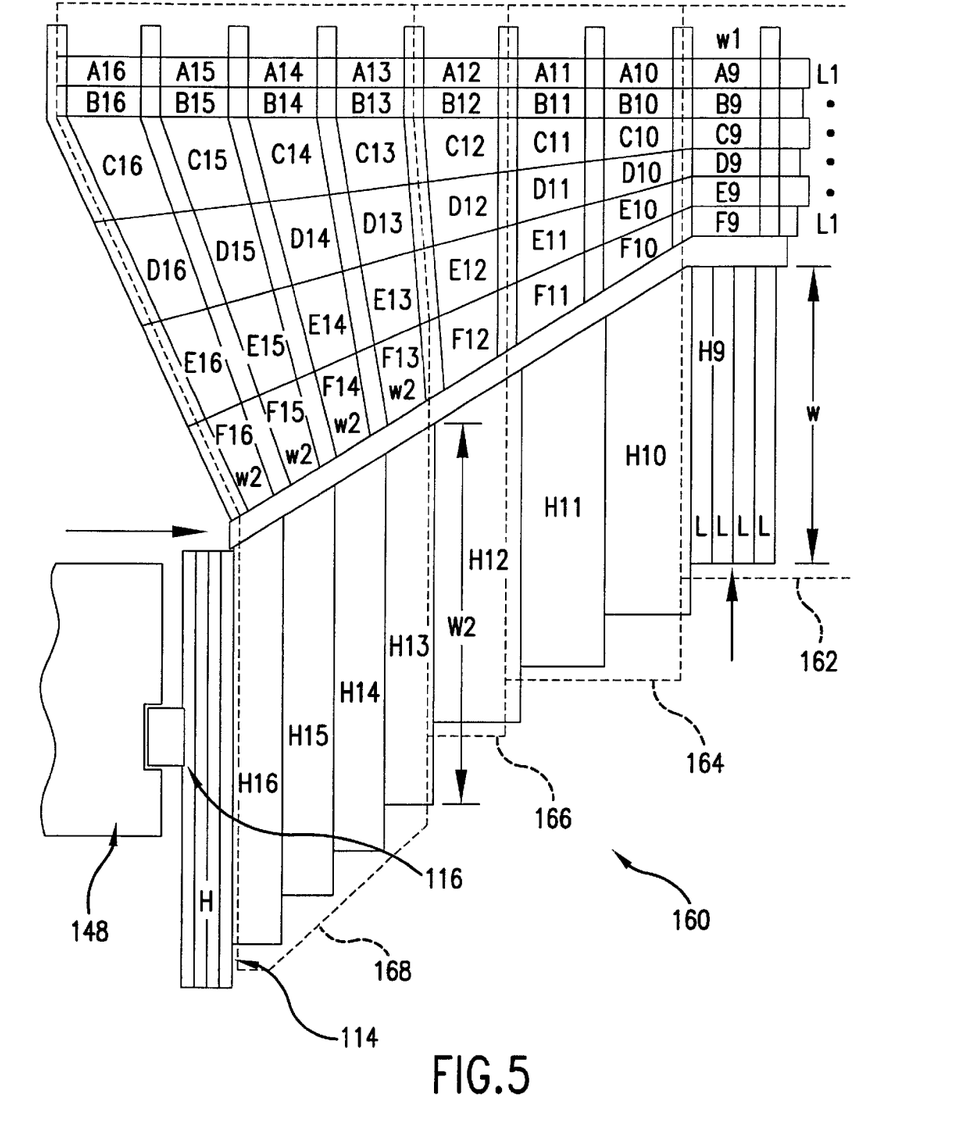
FIG. 5 is an enlarged plan view of a final wedge portion of the wedge tap region of the layout diagram of FIG. 1.

In FIG. 4, initial wedge portion 150 includes regions 152, 154, 156 and 158. In FIG. 5, final wedge portion 160 includes regions 162, 164, 166 and 168. Regions 158 and 162 are central regions and have idential geometries. Readout subsection 106 (FIG. 1) includes initial wedge portion 150, a central portion made of as many columns as required of the type depicted by region 158 or 162, and final wedge portion 160.

A column from a central portion of readout subsection 106 is depicted at 158 of FIG. 4 or 162 of FIG. 5. In FIG. 5, for example, central column 162 includes wells A9, B9, C9, D9, E9 and F9 disposed between imaging section 102 and transfer gate 146. There is no difference in well dimensions that is dependent on which side of row direction line RDL the well is located. The clocking structure is operated to sequentially transfer charge from imaging section 102 through wells A9, B9, C9, D9, E9 and F9 through transfer gate 146 into a well of a corresponding element in horizontal register segment 112 (element H9 depicted here as a four phase register element, but may be 2 phase, three phase or any other number of phases). Readout subsection 106 may include any number of central columns (e.g., 162) or may include no central columns (i.e., wedge portions adjoin).

The output end of readout subsection 106 includes final wedge portion 160 (FIG. 5). Begining with wells A10, B10, C10, D10, E10 and F10 and continuing through wells A16, B16, C16, D16, E16 and F16, the clock lines between row direction line RDL and transfer gate 146 bend and "flare". However, channels 144 in which are formed wells A10, B10, C10, D10, E10 and F10 and wells A11, B11, C11, D11, E11 and F11 remain straight.

Each column register 110 of a first plurality of column registers (e.g., defined by region 164) includes a first register portion defined between imaging section 102 and row direction line RDL that is co-parallel with column direction line CDL and a second register portion defined between row direction line RDL and transfer gate 146 that is also co-parallel with column direction line CDL.

The first register portion includes no elements, one element or a plurality of column elements or no wells, one well or a plurality of column wells (e.g., a first column register defined by wells A10, B10 and a second column register defined by wells A11, B11). The column elements of all of first register portions of the first plurality of column registers (e.g., region 164) constitute a plurality of row registers of a first orientation (e.g., a first row register defined by wells A10 and A11, and a second row register defined by wells B10 and B11 are horizontal). Each of the plurality of row registers have a first orientation co-parallel to row direction line RDL.

The second register portion of each column register defined between row direction line RDL and transfer gate 146 includes one element or a plurality of column elements or one well or a plurality of column wells (e.g., a first column register defined by wells C10, D10, E10 and F10 and a second column register defined by wells C11, D11, E11 and F11). The column elements or wells of all of second register portions of the first plurality of column registers (e.g., region 164) constitute a plurality of row registers of a second orientation (e.g., a row defined by wells C10, C11 and a row defined by wells D10, D11, and a row defined by wells E10, E11, and a row defined by wells F10, F11). Each of the plurality of row registers of the second orientation are splayed so as to droop with respect to row direction line RDL, although at different splay angles.

Transfer gate 146 controls the transfer of the charge in wells F10 and F11 into horizontal register elements H10 and H11, respectively.

Each column register 110 of a first plurality of column registers (e.g., defined by region 168) includes a first register portion defined between imaging section 102 and row direction line RDL that is co-parallel with column direction line CDL and a second register portion defined between row direction line RDL and transfer gate 146 that is splayed outward with respect to column direction line CDL. The second portion of each column register 110 is splayed outward with respect to column direction line CLD at a different angle than the other column registers of region 168 (FIG. 5).

The first register portion includes no elements, one element or a plurality of column elements or no wells, one well or a plurality of column wells (e.g., a first column register defined by wells A13, B13 and a second column register defined by wells A14, B14 and a third column register defined by wells A15, B15 and a fourth column register defined by wells A16, B16). The column elements of all of first register portions of the first plurality of column registers (e.g., region 168) constitute a plurality of row registers of a first orientation (e.g., a first row register defined by wells A13, A14, A15, A16 and a second row register defined by wells B13, B14, B15, B16 are horizontal). Each of the plurality of row registers have a first orientation co-parallel to a row direction line The second register portion of each column register defined between row direction line RDL and transfer gate 146 includes a plurality of column elements (e.g., a first column register defined by wells C13, D13, E13, F13 and a second column register defined by wells C14, D14, E14, F14 and a third column register defined by wells C15, D15, E15, F15 and a fourth column register defined by wells C16, D16, E16, F16). The column elements of all of second register portions of the first plurality of column registers (e.g., region 168) constitute a plurality of row registers of a second orientation (e.g., a row defined by wells C13, C14, C15, C16 and a row defined by wells D13, D14, D15, D16 and a row defined by wells E13, E14, E15, E16 and a row defined by wells F13, F14, F15, F16). Each of the plurality of row registers of the second orientation being splayed so as to droop with respect to row direction line RDL, although at different splay angles.

Transfer gate 146 controls the transfer of the charge in wells F13, F14, F15 and F16 into horizontal register elements H13, H14, H15 and H16, respectively.

It will be appreciated by persons skilled in the art that wedge tap 140 need not include rows A and B (i.e., the first portion of column registers 110 as discussed above). Wedge tap 140 need not include wells A1 through A16 and need not include wells B1 through B16. Rows A and B maybe regarded as part of imaging section 102 (FIG. 1).

The column register defined between row direction line RDL and transfer gate 146 that includes wells C12, D12, E12, F12 (i.e., region 166 of FIG. 5) has a width that narrows a little from W1 at well C12 to a lesser width at well E12 intermediate to W1 and W2, but does not quite narrow to a width of W2 as in region 168 of FIG. 5. The requirement is that transfer gate 146 efficiently control the transfer of the charge in well F12 into horizontal register elements H12.

In FIG. 5, horizontal readout register elements H9 through H16 are shown. Four phase horizontal register elements are shown, but these elements may be three or two phase as well. Elements H9, H10, H11 and H12 each have a length (in the direction of charge transfer) that is equal to the array pitch (width W1 of channel 144 plus a width of channel stop 142) and a width, W, sufficient to hold the designed maximum quantity of the charge held in wells in row F. The intermediate width of well F12 is chosen so that when the transfer gate 146 enables a transfer, charge from well F12 transfers to one of the wells in horizontal readout register element H12 without spilling into adjacent elements. However, width W2 of wells F13, F14, F15 and F16 is so narrow that the length of horizontal readout register elements H13, H14, H15 and H16 (in the charge transfer direction) must be shorted to ensure efficient charge transfer without spilling into adjacent register elements. The width of horizontal readout register elements H13, H14, H15 and H16 (in a direction perpendicular to the charge transfer direction) is widened to ensure that each of elements H13, H14, H15 and H16 will carry all of the design maximum quantity of charge without blooming.

The initial wedge portion 150 depicted in FIG. 4 is preferably symmetric about column direction line CDL with respect to final wedge portion 160 (FIG. 5). Between adjacent horizontal readout register segments 112 is a layout area that includes space for output node structure 116 and isolation register 114 between node structure 116 and register segment 112 as well as additional layout area 148. In additional layout area 148, a first stage of buffer amplifier 108 may be disposed, and source diffusion 130 and set gate electrode 136 (FIG. 2) may be disposed as well as an isolation register element or two (not shown) coupled between source diffusion 130 and a first stage element of horizontal readout register segment 112.

With reference to FIGS. 4 and 5, one embodiment of a charge coupled device includes a first plurality of column registers (e.g., a column made from wells C1 through F1 and a column made from wells C2 through F2) splayed with respect to and on one side of column direction line CDL (FIG. 3) and a second plurality of column registers (e.g., a column made from wells C15 through F15 and a column made from wells C16 through F16) splayed with respect to and on another side of column direction line CDL (FIG. 3). The device also includes a first register segment (e.g., register elements H1 and H2) coupled to the first plurality of column registers, and a second register segment (e.g., register elements H15 and H16) coupled to the second plurality of column registers. The device is arranged so that the second register segment is spaced apart from the first register segment so as to define a layout area between the first and second register segments. Either isolation register element 114 or output node 116, or both, is disposed in the layout area. Each column register of the first plurality of column registers includes a plurality of column element wells (e.g., wells C1 through F1 in one column and wells C2 through F2 in another column). The column element wells of all of the first plurality of column registers constitute a plurality of well rows (e.g., well row C1–C2, well row D1–D2, well row E1–E2 and well row F1–F2), and each of the plurality of well rows are splayed with respect to row direction line RDL (FIG. 3).

With reference to FIGS. 4 and 5, another embodiment of a charge coupled device includes a first plurality of column registers (e.g., a column made from wells C1 through F1, a column made from wells C2 through F2, a column made from wells C3 through F3 and a column made from wells C4 through F4) disposed on one side of column direction line CDL where each column register is splayed with respect to column direction line CDL by a corresponding and unique angle. A second plurality of column registers (e.g., a column made from wells C13 through F13, a column made from wells C14 through F14, a column made from wells C15 through F15 and a column made from wells C16 through F16) disposed on another side of column direction line CDL where each column register is splayed with respect to column direction line CDL by a corresponding and unique angle. A first register segment (e.g., elements H1 through H4) is coupled to the first plurality of column registers, and a second register segment (e.g., elements H13 through H16) is coupled to the second plurality of column registers. The second register segment is spaced apart from the first register segment so as to define a layout area between the first and second register segments. Ether isolation register element 114 or output node 116, or both, is disposed in the layout area.

With reference to FIGS. 4 and 5, another embodiment of a charge coupled device includes a first plurality of column registers (e.g., a column made from wells A1 through F1 and a column made from wells A2 through F2). Each column register includes a first register portion (e.g., a portion made from wells A1 through B1 and a portion made from wells A2 through B2) co-parallel with column direction line CDL and a second register portion (e.g., a portion made from wells C1 through F1 and a portion made from wells C2 through F2) splayed with respect to and on one side of column direction line CDL. The device also includes a second plurality of column registers (e.g., a column made from wells A15 through F15 and a column made from wells A16 through F15). Each column register includes a first register portion (e.g., a portion made from wells A15 through B15 and a portion made from wells A16 through B16) co-parallel with column direction line CDL and a second register portion (e.g., a portion made from wells C15 through F15 and a portion made from wells C16 through F16) splayed with respect to and on another side of the column direction line. A first register segment (e.g., elements H1 and H2) is coupled to the second register portion of the first plurality of column registers, and a second register segment (e.g., elements H15 and H16) coupled to the second register portion of the second plurality of column registers. The second register segment is spaced apart from the first register segment so as to define a layout area between the first and second register segments. Either isolation register element 114 or output node 116, or both, is disposed in the layout area.

With reference to FIGS. 4 and 5, another embodiment of a charge coupled device includes a first plurality of column registers (e.g., a column made from wells A1 through F1 and a column made from wells A2 through F2). Each column register of the first plurality of column registers includes a first register portion (e.g., a portion made from wells A1 through B1 and a portion made from wells A2 through B2) co-parallel with column direction line CDL and a second register portion (e.g., a portion made from wells C1 through F1 and a portion made from wells C2 through F2) splayed with respect to column direction line CDL. The first register portion of each column register of the first plurality of column registers includes a plurality of column element wells. The column element wells of all of first register portions of the first plurality of column registers constitute a first plurality of well rows (e.g., well row A1–A2 and well row B1–B2) where each of the first plurality of well rows is co-parallel to row direction line RDL. The second register portion of each column register of the first plurality of column registers includes a plurality of column element wells. The column element wells of all of second register portions of the first plurality of column registers constitute a second plurality of well rows (e.g., well row C1–C2, well row D1–D2, well row E1–E2 and well row F1–F2) where each of the second plurality of well rows is splayed with respect to the row direction line.

With reference to FIGS. 4 and 5, another embodiment of a charge coupled device includes a first plurality of column registers (e.g., a column made from wells A6 through F6 and a column made from wells A7 through F7). Each column register of the first plurality of column registers includes a first register portion (e.g., a portion made from wells A6 through B6 and a portion made from wells A7 through B7) co-parallel with column direction line CDL and a second register portion (e.g., a portion made from wells C6 through F6 and a portion made from wells C7 through F7) also co-parallel with column direction line CDL. The first register portion of each column register of the first plurality of column registers includes a plurality of column element wells (e.g., wells A6, A7, B6 and B7). The column element wells of all of first register portions of the first plurality of column registers constitute a first plurality of well rows (e.g., well row A6–A7 and well row B6–B7) where each of the first plurality of well rows is co-parallel to row direction line RDL. The second register portion of each column register of the first plurality of column registers includes a plurality of column element wells (e.g., wells C6, C7, D6, D7, E6, E7, F6 and F7). The column element wells of all of second register portions of the first plurality of column registers constitute a second plurality of well rows (e.g., well row C–C7, well row D6–D7, well row E6–E7 and well row F6–F7) where each of the second plurality of well rows is splayed with respect to row direction line RDL.

In FIG. 1, sensor 100 is depicted with only four readouts subsections for illustrative purposes. It will be appreciated that practical and useful sensors may be formed of many more readout subsections (or fewer). Although FIGS. 1 and 3 depict symmetrically angled wedge taps 140, asymmetrically angled taps are contemplated as well.

Curved or arc like variants of column registers 110 may provide the same or similar layout for isolation register 114, output node structure 116 and additional area 148, and are therefore equivalent to column registers 110 depicted in FIG. 3. Charge packets are still transferred down each column register from a first register element having width W1 to a last register element having width W2. At the same time, the length of each register element in column registers 110 increases so as to maintain the same or greater area. In this way, charge is not lost to blooming.

Register architectures other than the one specifically depicted in FIGS. 1 and 3 are contemplated; The object is to provide a layout area between horizontal register segments sufficient to provide a couple of isolation register elements and an output node structure. For example, in a frame transfer sensor, the storage array includes many register elements in each vertical storage column. Some or all of the register elements in vertical storage columns may be incorporated in the the wedge tap structure, the remaining elements being vertical and parallel with column direction line CDL. For example, in a frame transfer sensor with a 256 by 256 storage section, only the final 8 register elements in the vertical storage columns (e.g., column registers 110) may be incorporated in wedge tap 140, the balance being essentially an extension of the vertical register columns in the imaging section. The same applies to frame-interline transfer sensors.

In an interline-transfer sensor (i.e., where the vertical storage columns are disposed between columns of photo sites), when an isolation section is disposed between the vertical storage columns and the horizontal readout section, it may be that the isolation registers in the isolation section, together with column registers 110 are incorporated in wedge tap 140. In a TDI CCD sensor with vertical columns of photo sites, when an isolation section is disposed between the vertical columns of photo sites and the horizontal readout section, it may be that the isolation registers in the isolation section, together with column registers 110 are incorporated in wedge tap 140. Persons skilled in the art will appreciate that combinations of these techniques and other variants are equivalent to the embodiments disclosed herein to provide a layout area between horizontal register segments sufficient to provide a couple of isolation register elements and an output node structure.

Having described preferred embodiments of novel CCD readout section with a wedge tap structure (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims.

What is claimed is:

1. A charge coupled device comprising:

a first plurality of column registers splayed with respect to and on one side of a column direction line;

a second plurality of column registers splayed with respect to and on another side of the column direction line;

a first register segment coupled to the first plurality of column registers;

a second register segment coupled to the second plurality of column registers, the second register segment being spaced apart from the first register segment so as to define a layout area between the first and second register segments; and at least one of an isolation register element and an output node disposed in the layout area, wherein each column register of the first plurality of column registers includes a plurality of column element wells, the column element wells of all of the first plurality of column registers constituting a plurality of well rows, each of the plurality of well rows being splayed with respect to a row direction line.

2. The device of claim 1, wherein:

the first register segment includes a plurality of segment elements;

each segment element is coupled to a corresponding column register of the first plurality of column registers;

each segment element is characterized by a respective element length in a charge transfer direction and a respective element width;

a first segment element of the plurality of segment elements is characterized by a first element length and a first element width;

a second segment element of the plurality of segment elements is characterized by a second element length and a second element width;

the first element length is greater than the second element length; and the first element width is less than the second element width.

3. The device of claim 2, wherein:

a first product is defined by the first element length multiplied by the first element width;

a second product is defined by the second element length multiplied by the second element width; and the first product is substantially equal to the second product.

4. The device of claim 1, wherein:

the first register segment includes a plurality of segment elements;

each segment element is coupled to a corresponding column register of the first plurality of column registers;

each segment element is characterized by a respective element length in a charge transfer direction and a respective element area;

a first segment element of the plurality of segment elements is characterized by a first element length and a first element area;

a second segment element of the plurality of segment elements is characterized by a second element length and a second element area;

the first element length is greater than the second element length; and the first element area is substantially equal to the second element area.

5. The device of claim 1, wherein:

the first register segment includes a plurality of segment elements;

a first segment element is coupled to a first column register of the first plurality of column registers;

the first segment element is characterized by a first element length in a direction transverse to the column direction line; and the first element length is smaller than an array pitch in a co-parallel directon.

6. The device of claim 1, wherein:

the first register segment includes a plurality of segment elements;

each segment element corresponds to and is coupled to a respective column register of the first plurality of column registers;

each segment element is characterized by a respective element length in a direction transverse to the column direction line;

an element length of a first segment element is substantially equal to an array pitch in the direction transverse to the column direction line; and an element length of a second segment element is smaller than the array pitch.

7. A charge coupled device comprising:

a first plurality of column registers disposed on one side of a column direction line, each column register being splayed with respect to the column direction line by a corresponding and unique angle, a row direction line being defined to traverse the column direction line, each column register of the first plurality of column registers including a plurality of column element wells, the column element wells of all of the first plurality of column registers constituting a plurality of well rows, each of the plurality of well rows being splayed with respect to the row direction line by a corresponding and unique angle;

a second plurality of column registers disposed on another side of the column direction line, each column register being splayed with respect to the column direction line by a corresponding and unique angle;

a first register segment coupled to the first plurality of column registers;

a second register segment coupled to the second plurality of column registers, the second register segment being spaced apart from the first register segment so as to define a layout area between the first and second register segments; and at least one of an isolation register element and an output node disposed in the layout area.

8. A charge coupled device comprising:

a first plurality of column registers disposed on one side of a column direction line, each column register being splayed with respect to the column direction line by a corresponding and unique angle;

a second plurality of column registers disposed on another side of the column direction line, each column register being splayed with respect to the column direction line by a corresponding and unique angle;

a first register segment coupled to the first plurality of column registers, the first register segment including a plurality of segment elements, each segment element being coupled to a corresponding column register of the first plurality of column registers, each segment element being characterized by a respective element length in a charge transfer direction and a respective element width, a first segment element of the plurality of segment elements being characterized by a first element length and a first element width, a second segment element of the plurality of segment elements being characterized by a second element length and a second element width, the first element length being greater than the second element length, the first element width being less than the second element width;

a second register segment coupled to the second plurality of column registers, the second register segment being spaced apart from the first register segment so as to define a layout area between the first and second register segments; and at least one of an isolation register element and an output node disposed in the layout area.

9. The device of claim 8, wherein:

a first product is defined by the first element length multiplied by the first element width;

a second product is defined by the second element length multiplied by the second element width; and the first product is substantially equal to the second product.

10. A charge coupled device comprising:

a first plurality of column registers disposed on one side of a column direction line, each column register being splayed with respect to the column direction line by a corresponding and unique angle;

a second plurality of column registers disposed on another side of the column direction line, each column register being splayed with respect to the column direction line by a corresponding and unique angle;

a first register segment coupled to the first plurality of column registers, the first register segment including a plurality of segment elements, each segment element being coupled to a corresponding column register of the first plurality of column registers, each segment element being characterized by a respective element length in a charge transfer direction and a respective element area, a first segment element of the plurality of segment elements being characterized by a first element length and a first element area, a second segment element of the plurality of segment elements being characterized by a second element length and a second element area, the first element length being greater than the second element length, the first element area being substantially equal to the second element area;

a second register segment coupled to the second plurality of column registers, the second register segment being spaced apart from the first register segment so as to define a layout area between the first and second register segments; and at least one of an isolation register element and an output node disposed in the layout area.

11. A charge coupled device comprising:

a first plurality of column registers disposed on one side of a column direction line, each column register being splayed with respect to the column direction line by a corresponding and unique angle;

a second plurality of column registers disposed on another side of the column direction line, each column register being splayed with respect to the column direction line by a corresponding and unique angle;

a first register segment coupled to the first plurality of column registers, the first register segment including a plurality of segment elements, a first segment element being coupled to a first column register of the first plurality of column registers, the first segment element being characterized by a first element length in a direction transverse to the column direction line, the first element length being smaller than an array pitch in a co-parallel direction;

a second register segment coupled to the second plurality of column registers, the second register segment being spaced apart from the first register segment so as to define a layout area between the first and second register segments; and at least one of an isolation register element and an output node disposed in the layout area.

12. A charge coupled device comprising:

a first plurality of column registers disposed on one side of a column direction line, each column register being splayed with respect to the column direction line by a corresponding and unique angle;

a second plurality of column registers disposed on another side of the column direction line, each column register being splayed with respect to the column direction line by a corresponding and unique angle;

a first register segment coupled to the first plurality of column registers, the first register segment including a plurality of segment elements, each segment element corresponding to and being coupled to a respective column register of the first plurality of column registers, each segment element being characterized by a respective element length in a direction transverse to the column direction line, an element length of a first segment element being substantially equal to an array pitch in the direction transverse to the column direction line, an element length of a second segment element being smaller than the array pitch;

a second register segment coupled to the second plurality of column registers, the second register segment being spaced apart from the first register segment so as to define a layout area between the first and second register segments; and at least one of an isolation register element and an output node disposed in the layout area.

13. A charge coupled device comprising:

a first plurality of column registers disposed on one side of a column direction line, each column register being splayed with respect to the column direction line by a corresponding and unique angle, each column register of the first plurality of column registers including a plurality of column element wells, the column element wells of all of the first plurality of column registers constituting a plurality of well rows, each of the plurality of well rows being splayed with respect to a row direction line;

a second plurality of column registers disposed on another side of the column direction line, each column register being splayed with respect to the column direction line by a corresponding and unique angle;

a first register segment coupled to the first plurality of column registers;

a second register segment coupled to the second plurality of column registers, the second register segment being spaced apart from the first register segment so as to define a layout area between the first and second register segments; and at least one of an isolation register element and an output node disposed in the layout area.

14. The device of claim 13, wherein:

the first register segment includes a plurality of segment elements;

each segment element is coupled to a corresponding column register of the first plurality of column registers;

each segment element is characterized by a respective element length in a charge transfer direction and a respective element width;

a first segment element of the plurality of segment elements is characterized by a first element length and a first element width;

a second segment element of the plurality of segment elements is characterized by a second element length and a second element width;

the first element length is greater than the second element length; and the first element width is less than the second element width.

15. The device of claim 14, wherein:

a first product is defined by the first element length multiplied by the first element width;

a second product is defined by the second element length multiplied by the second element width; and the first product is substantially equal to the second product.

16. The device of claim 13, wherein:

the first register segment includes a plurality of segment elements;

each segment element is coupled to a corresponding column register of the first plurality of column registers;

each segment element is characterized by a respective element length in a charge transfer direction and a respective element area;

a first segment element of the plurality of segment elements is characterized by a first element length and a first element area;

a second segment element of the plurality of segment elements is characterized by a second element length and a second element area;

the first element length is greater than the second element length; and the first element area is substantially equal to the second element area.

17. The device of claim 13, wherein:

the first register segment includes a plurality of segment elements;

a first segment element is coupled to a first column register of the first plurality of column registers;

the first segment element is characterized by a first element length in a direction transverse to the column direction line; and the first element length is smaller than an array pitch in a co-parallel directon.

18. The device of claim 13, wherein:

the first register segment includes a plurality of segment elements;

each segment element corresponds to and is coupled to a respective column register of the first plurality of column registers;

each segment element is characterized by a respective element length in a direction transverse to the column direction line;

an element length of a first segment element is substantially equal to an array pitch in the direction transverse to the column direction line; and an element length of a second segment element is smaller than the array pitch.

19. A charge coupled device comprising:

a first plurality of column registers, each column register including a first register portion co-parallel with a column direction line and a second register portion splayed with respect to and on one side of the column direction line;

a second plurality of column registers, each column register including a first register portion co-parallel with the column direction line and a second register portion splayed with respect to and on another side of the column direction line;

a first register segment coupled to the second register portion of the first plurality of column registers;

a second register segment coupled to the second register portion of the second plurality of column registers, the second register segment being spaced apart from the first register segment so as to define a layout area between the first and second register segments; and at least one of an isolation register element and an output node disposed in the layout area.

20. The device of claim 19, wherein the first register portion of each column register of the first plurality of column registers and the first register portion of each column register of the second plurality of column registers constitute a uniformely spaced array of register portions.

21. The device of claim 19, wherein:

the first register segment includes a plurality of segment elements;

each segment element is coupled to a corresponding second register portion of a column register of the first plurality of column registers;

each segment element is characterized by a respective element length in a charge transfer direction and a respective element width;

a first segment element of the plurality of segment elements is characterized by a first element length and a first element width;

a second segment element of the plurality of segment elements is characterized by a second element length and a second element width;

the first element length is greater than the second element length; and the first element width is less than the second element width.

22. The device of claim 21, wherein:

a first product is defined by the first element length multiplied by the first element width;

a second product is defined by the second element length multiplied by the second element width; and the first product is substantially equal to the second product.

23. The device of claim 19, wherein:

the first register segment includes a plurality of segment elements;

each segment element is coupled to a corresponding second register portion of a column register of the first plurality of column registers;

each segment element is characterized by a respective element length in a charge transfer direction and a respective element area;

a first segment element of the plurality of segment elements is characterized by a first element length and a first element area;

a second segment element of the plurality of segment elements is characterized by a second element length and a second element area;

the first element length is greater than the second element length; and the first element area is substantially equal to the second element area.

24. The device of claim 19, wherein:

the first register segment includes a plurality of segment elements, a first segment element is coupled to a second register portion of a first column register of the first plurality of column registers;

the first segment element is characterized by a first element length in a direction transverse to the column direction line; and the first element length is smaller than an array pitch in a co-parallel directon.

25. The device of claim 19, wherein:

the first register segment includes a plurality of segment elements;

each segment element corresponds to and is coupled to a respective second register portion of a column register of the first plurality of column registers;

each segment element is characterized by a respective element length in a direction transverse to the column direction line;

an element length of a first segment element is substantially equal to an array pitch in the direction transverse to the column direction line; and an element length of a second segment element is smaller than the array pitch.

26. The device of claim 19, wherein:

each second register portion of a column register of the first plurality of column registers includes a plurality of column element wells;

the column element wells of all of the second register portions of the first plurality of column registers constitute a plurality of well rows; and each of the plurality of well rows are splayed with respect to a row direction line.

27. A charge coupled device comprising a first plurality of column registers, wherein:

each column register of the first plurality of column registers includes a first register portion co-parallel with a column direction line and a second register portion splayed with respect to the column direction line;

the first register portion of each column register of the first plurality of column registers includes a plurality of column element wells;

the column element wells of all of first register portions of the first plurality of column registers constitute a first plurality of well rows, each of the first plurality of well rows being co-parallel to a row direction line;

the second register portion of each column register of the first plurality of column registers includes a plurality of column element wells; and the column element wells of all of second register portions of the first plurality of column registers constitute a second plurality of well rows, each of the second plurality of well rows being splayed with respect to the row direction line.

28. The device of claim 27, further comprising a second plurality of column registers, wherein:

each column register of the second plurality of column registers includes a first register portion co-parallel with a column direction line and a second register portion splayed with respect to the column direction line;

the first register portion of each column register of the second plurality of column registers includes a plurality of column element wells;

the column element wells of all of first register portions of the second plurality of column registers constitute a third plurality of well rows, each of the third plurality of well rows being co-parallel to the row direction line;

the second register portion of each column register of the second plurality of column registers includes a plurality of column element wells; and the column element wells of all of second register portions of the second plurality of column registers constitute a fourth plurality of well rows, each of the fourth plurality of well rows being splayed with respect to the row direction line.

29. A charge coupled device comprising a first plurality of column registers, wherein:

each column register of the first plurality of column registers includes a first register portion co-parallel with a column direction line and a second register portion also co-parallel with the column direction line;

the first register portion of each column register of the first plurality of column registers includes a plurality of column element wells;

the column element wells of all of first register portions of the first plurality of column registers constitute a first plurality of well rows, each of the first plurality of well rows being co-parallel to a row direction line;

the second register portion of each column register of the first plurality of column registers includes a plurality of column element wells; and the column element wells of all of second register portions of the first plurality of column registers constitute a second plurality of well rows, each of the second plurality of well rows being splayed with respect to the row direction line.

30. A charge coupled device comprising a first plurality of column registers disposed on one side of a column direction line, wherein:

each column register is splayed with respect to the column direction line by a corresponding and unique angle;

a row direction line is defined to traverse the column direction line;

each column register of the first plurality of column registers includes a plurality of column element wells, the column element wells of all of the first plurality of column registers constituting a plurality of well rows; and each of the plurality of well rows is splayed with respect to the row direction line by a corresponding and unique angle.

31. The device of claim 30, further comprising a first register segment coupled to the first plurality of column registers, wherein:

the first register segment includes a plurality of segment elements;

each segment element is coupled to a corresponding column register of the first plurality of column registers;

each segment element is characterized by a respective element length in a charge transfer direction and a respective element width;

a first segment element of the plurality of segment elements is characterized by a first element length and a first element width;

a second segment element of the plurality of segment elements is characterized by a second element length and a second element width;

the first element length is greater than the second element length; and the first element width is less than the second element width.

32. The device of claim 30, further comprising a first register segment coupled to the first plurality of column registers, wherein:

the first register segment includes a plurality of segment elements;

each segment element is coupled to a corresponding column register of the first plurality of column registers;

each segment element is characterized by a respective element length in a charge transfer direction and a respective element area;

a first segment element of the plurality of segment elements is characterized by a first element length and a first element area;

a second segment element of the plurality of segment elements is characterized by a second element length and a second element area;

the first element length is greater than the second element length; and the first element area is substantially equal to the second element area.

33. The device of claim 30, further comprising a first register segment coupled to the first plurality of column registers, wherein:

the first register segment includes a plurality of segment elements;

a first segment element is coupled to a first column register of the first plurality of column registers;

the first segment element is characterized by a first element length in a direction transverse to the column direction line; and the first element length is smaller than an array pitch in a co-parallel direction.

34. The device of claim 30, further comprising a first register segment coupled to the first plurality of column registers, wherein:

the first register segment includes a plurality of segment elements;

each segment element corresponds to and is coupled to a respective column register of the first plurality of column registers;

each segment element is characterized by a respective element length in a direction transverse to the column direction line;

an element length of a first segment element is substantially equal to an array pitch in the direction transverse to the column direction line; and an element length of a second segment element is smaller than the array pitch.

35. A charge coupled device comprising a first plurality of column registers disposed on one side of a column direction line and a first register segment coupled to the first plurality of column registers, wherein:

each column register is splayed with respect to the column direction line by a corresponding and unique angle;

the first register segment includes a plurality of segment elements;

each segment element is coupled to a corresponding column register of the first plurality of column registers;

each segment element is characterized by a respective element length in a charge transfer direction and a respective element area;

a first segment element of the plurality of segment elements is characterized by a first element length and a first element area;

a second segment element of the plurality of segment elements is characterized by a second element length and a second element area;

the first element length is greater than the second element length; and the first element area is substantially equal to the second element area.

* * * * *